US007161366B2

(12) United States Patent
Herrick et al.

(10) Patent No.: US 7,161,366 B2
(45) Date of Patent: Jan. 9, 2007

(54) METHOD AND APPARATUS FOR PROBE TIP CONTACT

(75) Inventors: Geoffrey Herrick, Portland, OR (US); James E. Spinar, Clackamas, OR (US); Daniel R. Murphy, Beaverton, OR (US); William R. Pooley, Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 16 days.

(21) Appl. No.: 10/987,353

(22) Filed: Nov. 12, 2004

(65) Prior Publication Data

US 2006/0103400 A1 May 18, 2006

(51) Int. Cl.
*G01R 31/02* (2006.01)

(52) U.S. Cl. ...................................... 324/754; 324/761

(58) Field of Classification Search ................ 324/761, 324/72.5, 133, 149; 439/78, 83, 55, 876
See application file for complete search history.

(56) References Cited

U.S. PATENT DOCUMENTS 5,622,519 A * 4/1997 Bixler et al. ................ 439/570
5,838,519 A * 11/1998 Takizawa et al. ........ 360/245.9
6,404,215 B1 * 6/2002 Nightingale et al. ........ 324/754
6,466,000 B1 * 10/2002 Nightingale ............... 324/72.5
6,685,514 B1 * 2/2004 Costa ......................... 439/876
6,692,265 B1 * 2/2004 Kung et al. ................... 439/68
6,888,362 B1 * 5/2005 Eldridge et al. ............ 324/757

* cited by examiner

*Primary Examiner*—Jermele Hollington
*Assistant Examiner*—Arleen M. Vazquez
(74) *Attorney, Agent, or Firm*—Moser, Patterson&Sheridan LLP

(57) ABSTRACT

The invention is a method and apparatus for a probe tip contact for electrically coupling a substrate to a probe tip. The apparatus, in one embodiment, comprises a wrap-around contact that is precision formed utilizing a hydro-form tool and brazed to a surface of a substrate. In another embodiment, the apparatus comprises a contact flange, a mounting flange extending from a first edge of the contact flange in an orientation substantially perpendicular to the contact flange, and a substantially circular indentation formed in the contact flange adapted for accommodating movement of said probe tip relative to said substrate.

46 Claims, 3 Drawing Sheets

130
126
134
140
152
144
150
137
128
138
142
136

300
304
314a
308
306a
306
318
320
314b
310
306b
316
306
312
302

METHOD AND APPARATUS FOR PROBE TIP CONTACT

FIELD OF THE INVENTION

The present invention generally relates to measurement probes. More specifically, the present invention relates to probe contacts for electrical wires and similar conductors.

BACKGROUND OF THE INVENTION

Voltage measurement probes couple an electrical signal from a device under test (DUT) to a test and measurement instrument, such as an oscilloscope and the like. Measurement probes include a probe head, a transmission line, such as a coaxial cable, and a connector housing having a signal connector, such as a BNC, SMA, BMA connector and the like, which connects to a mating signal connector on the measurement instrument. The probe head generally includes a metal tube or housing having a substrate disposed therein. A probing tip (or socket) is disposed in a holder that is inserted into one end of the probe head. The probe tip or socket extends from the holder and is electrically coupled to the substrate. The substrate has passive or active circuitry formed thereon that provides high impedance to the circuit generating the signal under test. The substrate circuitry is electrically coupled to the transmission line. The other end of the transmission line is electrically coupled to the signal connector.

The electrical connection between the substrate and the probe tip (or socket) is facilitated by a contact that extends over an end of the substrate. Conventional probe tip contacts are typically formed from electrically conductive materials such as gold foil, ribbon, or an electrically conductive elastomer. While conventional contacts have generally proven to be effective means of establishing electrical connections, such contacts are frequently prone to mechanical wear, misalignment, breakage and punch-through, typically resulting in degradation of the contact and outright failure or loss of the electrical connection. Thus, the reliability of conventional probe tip contacts over time is compromised.

Furthermore, conventional probe tips are typically permanently fixed to the contacts (e.g., by soldering) to maintain a reliable electrical connection. This makes removal of probe tips (e.g., for replacement) difficult and costly.

Thus, there is a need in the art for a probe tip contact that is capable of establishing a flexible, yet reliable long-term electrical coupling between a substrate and a probe tip.

SUMMARY OF THE INVENTION

The disadvantages of the prior art are overcome by the present invention of an apparatus for electrically coupling a substrate to a probe tip. The apparatus, in one embodiment, comprises a wrap-around contact that is precision formed utilizing a hydroform tool and brazed to a surface of a substrate. In another embodiment, the apparatus comprises a contact flange, a mounting flange extending from a first edge of the contact flange in an orientation substantially perpendicular to the contact flange, and a substantially circular indentation formed in the contact flange adapted for interfacing with said probe tip.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof, which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Figure 1:
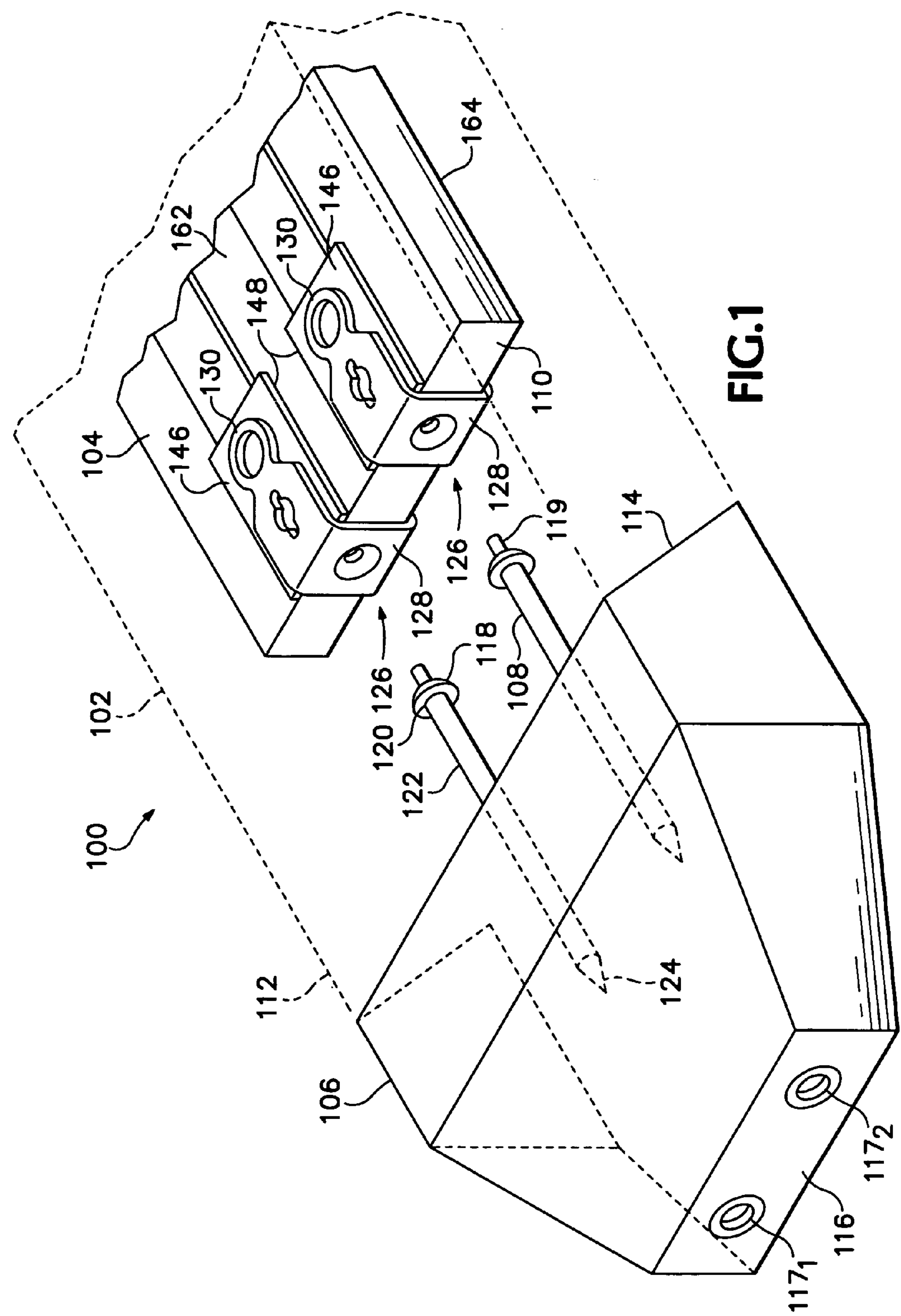
FIG. 1 is an exploded view of a portion of an exemplary probe head in which embodiments of the present invention may be used.

FIG. 1 depicts an exploded view of an exemplary probe head assembly 100 for use in a modular probe (not shown) in which the present invention may be used. Measurement probes are well known in the art. One example of a measurement probe that may be advantageously adapted to benefit from the present invention is the Venom family of probes, which are commercially available from Tektronix Inc., of Beaverton, Oreg. However, one skilled in the art will appreciate that the teachings of the present invention may be implemented in other types of measurement probes and, as such, the exemplary probe head should not be considered limiting.

A probe head assembly 100 generally comprises a housing 102 (shown in phantom), a substrate 104, a probe tip holder 106, and one or more probe tips 108 formed of an electrically conductive material such as copper or aluminum. In one embodiment, the housing 102 is a tubular structure within which the substrate 104 is disposed, and the housing 102 is typically formed of a conductive material, such as nickel plated brass, and the like. The substrate 104 comprises a plurality of passive and active electrical components (not shown) mounted thereon to form a circuit for illustratively measuring and/or processing various electrical signals (e.g., voltage or current, among others). In one embodiment, the substrate 104 comprises a printed circuit board (PCB). Although not explicitly shown in FIG. 1, a first end 110 of the substrate 104 extends past a first end 112 of the housing 102 and into a hollow cavity 114 in the probe tip holder 106.

The probe tip holder 106 comprises a socket 116 having one or more bores 117 (e.g., bores $\mathbf{117}_1$, and $\mathbf{117}_2$) for respectively receiving and guiding the one or more probe tips 108, and for securing the probe tips 108 in a fixed position relative to the socket 116. In particular, the one or more probe tips 108 each comprises a shank 122 having a first end 120, a second end 124, and a head 118. In one embodiment, the head 118 has a diameter greater than a diameter of the shank 122, and is coupled to the first end 120 of the shank 122. The second end 124 of the shank 122 extends a distance from the head 118, and in one embodiment, the second end 124 may be tapered.

During fabrication, the second end 124 and shank 122 slidably extend through the socket bore 117 and extend a distance beyond an outer surface of the socket 116. It is noted that the bores 117 of the socket 116 are sized to receive the diameter of the shank 122. Furthermore, the head 118 of the probe tip 108 has a diameter greater than the diameter of the socket bores 117. Accordingly, the head 118 of the probe tip 108 abuts an inner surface of the socket 116, thereby preventing the probe tip 108 from disengaging from the socket 116 of the probe tip holder 106. It is further noted that in one embodiment, the head 118 or shank 122 may be keyed to prevent the probe tip 108 from rotating and/or further securing the probe tip 108 within the socket 116. It is noted that the probe tip 108 may be formed as a lathe-turned piece, or by any other conventional manner. As will be discussed in further detail below, the substrate 104 and contacts 126, which are coupled to the substrate 104, secure the head 118 of the probe tip 108 against an inner surface of the socket 116. In one embodiment, an insulating material (e.g., a plastic) is disposed in the bore 117 to isolate the probe tip 108 from the socket 116. Alternatively, substantially the entire socket 116 may be formed of an insulating material, such as a plastic or rubber material so that the socket 116 is not electrically conductive.

Figure 2A:
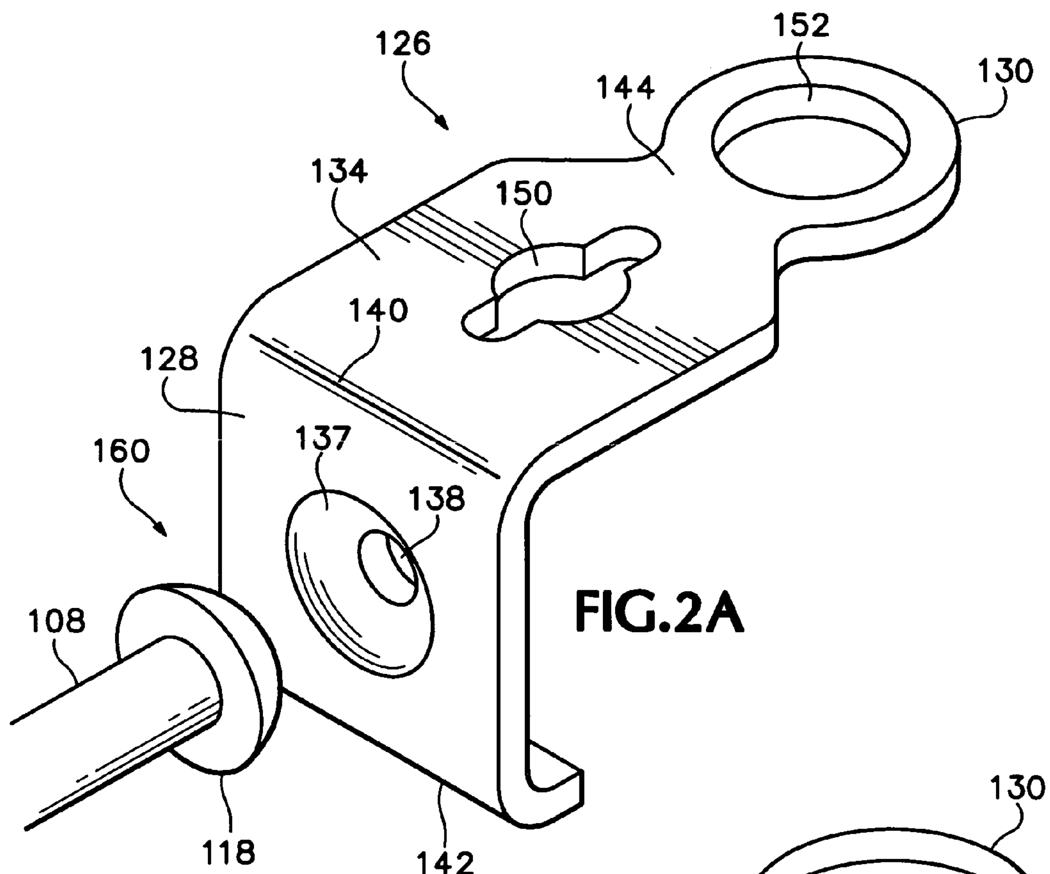
FIGS. 2A and 2B are isometric views of one embodiment of a probe tip contact of the probe head of FIG. 1.
Figure 2B:
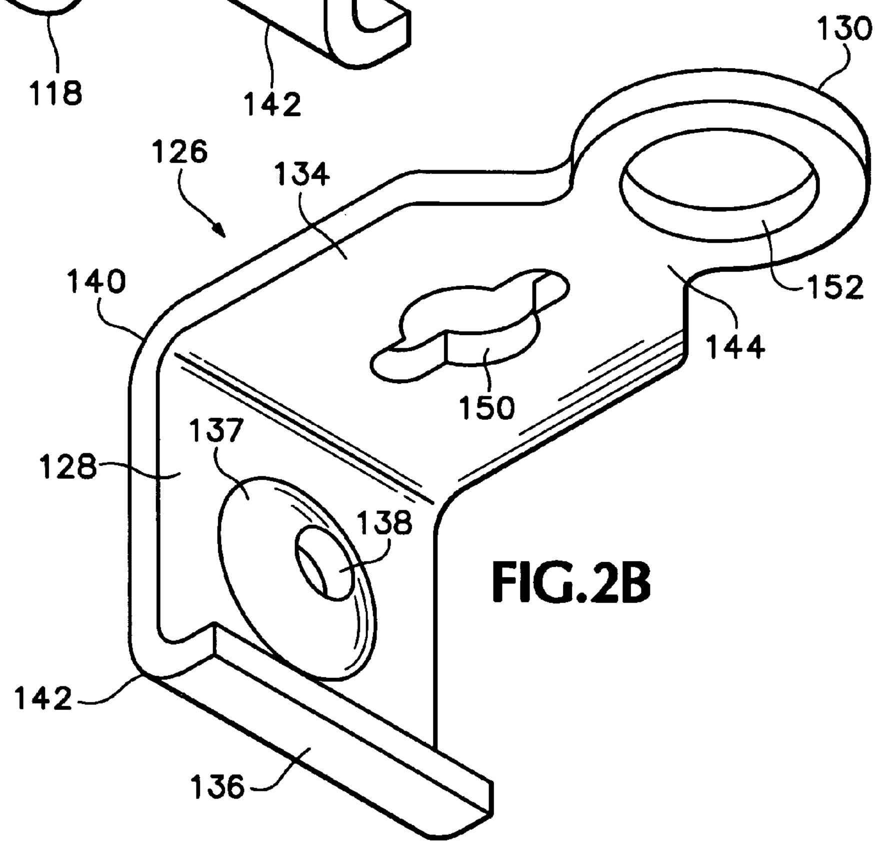

At least one contact 126 is coupled to the substrate 104 (e.g., by brazing, soldering or conductive adhesive) to facilitate the electrical connection between the substrate 104 and the one or more probe tips 108. Referring to FIG. 1 and to FIGS. 2A and 2B together, in one embodiment, the contact 126 comprises a unitary formed conductive flange that wraps around and extends over the first edge 110 of the substrate 104. The contact 126 comprises a contact flange 128 and a mounting flange 134.

The contact flange 128 includes a substantially circular indentation 137. The indentation 137 is sized to receive a top portion of the head 118 of the probe tip 108, and the head 118 and indentation 137 together form a ball-and-socket joint 160. The ball-and-socket joint 160 accommodates movement of the probe tip 108 in 2 axes: forward motion (i.e., through the socket 116) and motion in a direction perpendicular to the probe tip's forward motion. Therefore, unlike prior art probe tips that are fixed in place, the probe tip 108 is allowed some degree of movement relative to the substrate 104 and contact 126, while still maintaining an electrical connection with the substrate 104. Moreover, because the probe tip 108 is not permanently fixed to the contact 126, the probe tip 108 may be easily removed for replacement. In one embodiment, an optional bore 138 is disposed approximately through the center of the indentation 137. The optional bore 138 is sized to receive a spur 119 formed on the head 118 of the probe tip 108. Thus, the presence of a spur 119 of the head 118 of the probe tip 108 will not disrupt the electrical connection between the probe tip 108 and the substrate 104 (via the contact 126) when the probe tip 108 shifts relative to the contact 126. Moreover, in one embodiment, while the probe tip 108 is allowed to move relative to the socket 116 (i.e., not keyed), the spur 119 allows the probe tip 108 to move without dislocating from the ball-and-socket joint 160.

The mounting flange 134 extends from a first edge 140 of the contact flange 128 in a substantially perpendicular orientation relative to the contact flange 128. Optionally, an opposing second flange 136 (see FIG. 2B) extends from a second opposing edge 142 of the contact flange 128, substantially parallel to the first edge 140, to facilitate alignment of the contact 126 with the substrate 104. In one embodiment, the contact 126 comprises both a mounting flange 134 and an opposing second flange 136, and both flanges 134, 136 are adapted to be fixed (e.g., by brazing), respectively, to first and second sides 162, 164 of the substrate 104. Fixing both flanges 134, 136 to the substrate 104 facilitates alignment of the contact 126 with the substrate 104 (i.e., so that the contact flange 128 is substantially parallel with the edge 110 of the substrate 104), which in turn facilitates proper alignment of the probe tips 108 within the probe head assembly 100. In one embodiment, the mounting flange 134 and opposing second flange 136 have different lengths (e.g., the mounting flange 134 has a length that is greater than the length of the second flange 136). It is noted that the contact flange 128 is spaced apart from the edge 110 of the substrate 104 a distance to provide sufficient clearance for the spur 19 to pass through the bore 138 of the contact flange 128 without interfering with the edge 110 of the substrate 104.

The mounting flange 134 comprises a solder flange 130. The solder flange 130 is coupled (e.g., integrally formed) at a distal end 144 opposite the first edge 142 of the contact flange 128. In one embodiment, the distal end 144 is tapered, and the solder flange 130 is circular in shape.

In one embodiment, at least one aperture 150 is formed in the mounting flange 134 between the first edge 142 and the distal end 144. In the embodiment shown in FIGS. 2A and 2B, a single aperture 150 is illustratively shown. The aperture 150 forms a fillet between a bonding pad 148 of the substrate 104 and the mounting flange 134 to increase the strength of the solder/brazing contact joint 146.

Furthermore, the solder flange 130 comprises at least one aperture (i.e., a second aperture) 152 formed therein. The second aperture 152 also forms a fillet between the bonding pad 148 of the substrate 104 and the mounting flange 134 to increase the strength of the solder/brazing contact joint 146.

Figure 3:
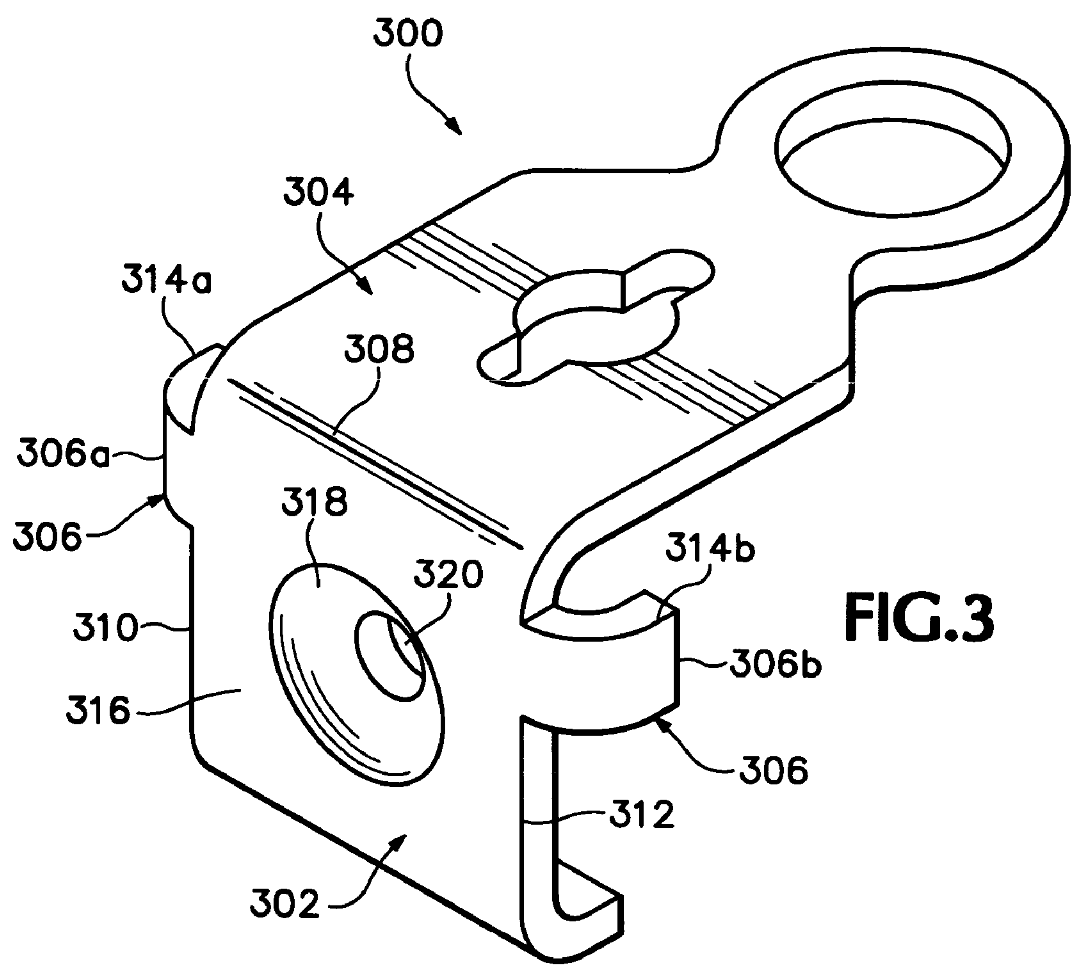
FIG. 3 is an isometric view of a second embodiment of a probe tip contact according to the present invention.

FIG. 3 depicts an isometric view of a second embodiment of a probe tip contact 300 according to the present invention. The contact 300 is substantially similar to the contact 126 described with reference to FIGS. 2A and 2B and comprises a unitary formed conductive flange that wraps around and extends over the first edge 110 of the substrate 104. The contact 300 comprises a contact flange 302 coupled to a mounting flange 304 along a first edge 308 of the contact flange 302. The contact flange 302 and the mounting flange 304 may be formed in any configuration described herein with reference to the contact flange 128 and mounting flange 134 of FIGS. 2A and 2B. In one embodiment, the contact flange 302 includes a substantially circular indentation 318 having an aperture 320 formed therein. The contact flange 302 illustrated in FIG. 3 further comprises at least two tabs 306*a* and 306*b* (hereinafter collectively referred to as "tabs 306") that extend outward from second and third edges 310 and 312, respectively, of the contact flange 302. The second and third edges 310, 312 are substantially perpendicular to the first edge 308 and substantially parallel to each other, so that the tabs 306 are positioned on opposite edges of the contact flange 302. In one embodiment, the tabs 306 bend slightly so that a free edge 314*a* or 314*b* is substantially perpendicular to the contact surface 316 of the contact flange 302.

The tabs 306 reduce the tendency of the contact 300 to deform under loading by assuming some of the load that is normally transmitted to the contact 300. That is, in the process of moving the contact 300 off the first end 110 of the substrate 104, a stress condition is created where the full load of the probe tip 108 is transmitted into the contact surface 316. This load could cause the contact 300 to deform, or to transmit shear load into the contact joint 146. The tabs 306 assume a portion of the load that would normally be transmitted to the contact 300 under these conditions, thereby reducing the stresses on the contact 300 and the tendency of the contact 300 to deform under heavy loading.

The contact 126 is formed in a shape and material that is adapted not only to fit closely to and mate with the first end 110 of the substrate 104, but to facilitate connection to the probe tip 108 as well. In one embodiment, the contact 126 is precision formed by hydroforming and then brazed to the substrate 104. In an exemplary hydroforming process, the contact 126 is manufactured by inserting a chem-milled blank into a negative die and forming the blank into shape using a Neutonian fluid. The hydroforming process produces a contact piece 126 that is mechanically robust and substantially resistant to mechanical wear or breakage. The formed contact 126 is then attached to a bonding pad 148 on the substrate 104, for example, by brazing to form a brazed contact/substrate joint 146. Alternatively, the contact 126 may be manufactured by other production means, such as stamping, among others.

In one embodiment, the contact/substrate joint 146 is fixed and heated by loading both ceramic hybrid and formed, plated wrap-around contacts 126 into a stainless steel fixture on a water-cooled tower and raising the fixture up into an induction coil. Oxide-free brazing, and a precise controllable temperature ramp may be insured by employing a quartz envelope containing a reducing atmosphere and a timer on the induction power supply. Brazing of the contact 126 to the substrate 104 will produce a secure mechanical and electrical connection that substantially prevents wear of the contact/substrate joint 146 and subsequent misalignment of the contact 126 relative to the probe tips 108. In one embodiment, brazing of the contact/substrate joint 146 is accomplished using a brazing alloy such as a silver/tin or silver/germanium brazing alloy, among others.

Thus, the contact 126 of the present invention provides a reliable electrical connection between a substrate 104 and a probe tip 108. Each contact 126 is formed in shape to fit closely with an edge 110 of the substrate 104 and to facilitate an electrical connection with a respective probe tip 108. The contact is shaped to form a ball-and-socket joint with the head of a probe tip, which insures reliable electrical coupling of the probe tip to the substrate without the need to permanently fix the probe tip to the substrate or contact. Hydroforming of the contact results in a contact piece that is mechanically robust and substantially resistant to mechanical wear or breakage. Brazing of the contact to the substrate results in a secure mechanical and electrical connection that substantially prevents wear of the contact/substrate joint and subsequent misalignment of the contact relative to the probe tip or substrate. Therefore, the contact remains substantially fixed in position, insuring a reliable mechanical and electrical performance.

While foregoing is directed to the preferred embodiment of the present invention, other and further embodiments of the invention may be devised without departing from the basic scope thereof, and the scope thereof is determined by the claims that follow.

What is claimed is:

1. Apparatus for electrically coupling a substrate to a probe tip, comprising:

a contact flange adapted for contacting the probe tip;

a mounting flange extending from a first edge of the contact flange in an orientation substantially perpendicular to the contact flange, said mounting flange adapted for coupling to a surface of the substrate; and a bore formed in the contact flange and adapted for receiving a spur formed on the probe tip.

2. The apparatus of claim 1, further comprising:

a solder flange extending from a distal end of said mounting flange, opposite said first edge of the contact flange.

3. The apparatus of claim 1, further comprising:

a second flange extending from a second edge of the contact flange in a spaced-apart relation to the mounting flange, the second edge extending substantially parallel to the first edge.

4. The apparatus of claim 1, wherein the contact flange further comprises:

a substantially circular indentation, said bore being formed substantially through a center of the indentation.

5. The apparatus of claim 4, wherein said substantially circular indentation is sized to receive a probe tip head coupled to said probe tip, said probe tip head and circular indentation forming a ball-and-socket joint.

6. The apparatus of claim 1, wherein the mounting flange further comprises:

at least one aperture.

7. The apparatus of claim 1, wherein the solder flange further comprises:

at least one aperture.

8. The apparatus of claim 1, wherein the contact flange further comprises:

at least first tab extending outward from a second edge of the contact flange; and at least a second tab extending outwardly a third edge of the contact flange, wherein the second and third edges are substantially perpendicular to the mounting flange and substantially parallel to each other.

9. Apparatus for electrically coupling a substrate to a probe tip, comprising:

a contact flange adapted for contacting the probe tip;

a mounting flange extending from a first edge of the contact flange in an orientation substantially perpendicular to the contact flange, said mounting flange adapted for coupling to a surface of the substrate; and a substantially circular indentation formed in the contact flange and adapted for interface with said probe tip.

10. The apparatus of claim 9, wherein said substantially circular indentation is adapted to receive a head of said probe tip, said head and indentation forming a ball-and-socket joint.

11. The apparatus of claim 9, further comprising:

a solder flange extending from a distal end of said mounting flange, opposite said first edge of the contact flange.

12. The apparatus of claim 9, further comprising:

a second flange extending from a second edge of the contact flange in a spaced-apart relation to the mounting flange, the second edge extending substantially parallel to the first edge.

13. The apparatus of claim 9, wherein the contact flange further comprises:

a bore formed substantially through a center of said substantially circular indentation.

14. The apparatus of claim 9, wherein the mounting flange further comprises:

at least one aperture.

15. The apparatus of claim 11, wherein the solder flange comprises:

at least one aperture.

16. The apparatus of claim 9, wherein the contact flange further comprises:

at least first tab extending outward from a second edge of the contact flange; and at least a second tab extending outwardly a third edge of the contact flange, wherein the second and third edges are substantially perpendicular to the mounting flange and substantially parallel to each other.

17. Apparatus for electrically coupling a substrate to a probe tip, comprising:

a contact flange adapted for contacting the probe tip;

a mounting flange extending from a first edge of the contact flange in an orientation substantially perpendicular to the contact flange, and adapted for coupling to a first surface of the substrate; and a second flange extending from a second edge of the contact flange in a spaced-apart relation to the mounting flange, the second edge being substantially parallel to the first edge, and adapted for coupling to a second surface of the substrate.

18. The apparatus of claim 17, further comprising:

a solder flange extending from a distal end of said mounting flange, and opposite said first edge of the contact flange.

19. The apparatus of claim 17, wherein the contact flange further comprises:

a substantially circular indentation.

20. The apparatus of claim 19, further comprising:

a bore formed substantially through a center of said indentation.

21. The apparatus of claim 17, wherein the mounting flange further comprises:

at least one aperture.

22. The apparatus of claim 17, wherein the solder flange further comprises: at least one aperture.

23. The apparatus of claim 17, wherein the contact flange further comprises:

at least first tab extending outward from a second edge of the contact flange; and at least a second tab extending outwardly a third edge of the contact flange, wherein the second and third edges are substantially perpendicular to the mounting flange and substantially parallel to each other.

24. A probe assembly comprising:

a housing;

a substrate disposed in said housing;

a probe tip holder secured to a first end of the substrate, the probe tip holder comprising a socket;

at least one probe tip extending from said housing and electrically coupled to said substrate; and at least one contact coupled to said substrate and adapted to provide physical and electrical connectivity between said substrate and a respective probe tip, each of said at least one contact comprising:

a contact flange adapted for contacting the probe tip;

a mounting flange extending from a first edge of the contact flange in an orientation substantially perpendicular to the contact flange, said mounting flange for coupling to a surface of the substrate; and a substantially circular indentation formed in the contact flange and adapted for interface with said probe tip.

25. The probe assembly of claim 24 wherein said substantially circular indentation is adapted to receive a head of said probe tip, said head and indentation forming a ball-and-socket joint.

26. The probe assembly of claim 24, further comprising:

a solder flange extending from a distal end of said mounting flange, opposite said first edge of the contact flange.

27. The probe assembly of claim 24, further comprising:

a second flange extending from a second edge of the contact flange in a spaced-apart relation to the mounting flange, the second edge extending substantially parallel to the first edge.

28. The probe assembly of claim 24, further comprising:

a bore formed substantially through a center of said substantially circular indentation.

29. The probe assembly of claim 24, wherein the mounting flange further comprises:

at least one aperture.

30. The probe assembly of claim 24, wherein the solder flange comprises at least one aperture.

31. The apparatus of claim 24, wherein the contact flange further comprises:

at least first tab extending outward from a second edge of the contact flange; and at least a second tab extending outwardly a third edge of the contact flange, wherein the second and third edges are substantially perpendicular to the mounting flange and substantially parallel to each other.

32. A probe assembly comprising:

a housing;

a substrate disposed in said housing;

a probe tip holder secured to a first end of the substrate, the probe tip holder comprising a socket;

at least one probe tip extending from said housing and electrically coupled to said substrate; and at least one contact coupled to said substrate and adapted to provide physical and electrical connectivity between said substrate and a respective probe tip, each of said at least one contact comprising:

a contact flange adapted for contacting the probe tip;

a mounting flange extending from a first edge of the contact flange in an orientation substantially perpendicular to the contact flange, said mounting flange for coupling to a surface of the substrate; and a bore formed in the contact flange and adapted for receiving a spur formed on the probe tip.

33. The apparatus of claim 32, further comprising:

a solder flange extending from a distal end of said mounting flange, opposite said first edge of the contact flange.

34. The apparatus of claim 32, further comprising:

a second flange extending from a second edge of the contact flange in a spaced-apart relation to the mounting flange, the second edge extending substantially parallel to the first edge.

35. The apparatus of claim 32, wherein the contact flange further comprises:

a substantially circular indentation, said bore being formed substantially through a center of the indentation.

36. The apparatus of claim 35, wherein said substantially circular indentation is sized to receive a probe tip head coupled to said probe tip, said probe tip head and circular indentation forming a ball-and-socket joint.

37. The apparatus of claim 32, wherein the mounting flange further comprises:

at least one aperture.

38. The apparatus of claim 32, wherein the solder flange further comprises: at least one aperture.

39. The apparatus of claim 32, wherein the contact flange further comprises:

at least first tab extending outward from a second edge of the contact flange; and at least a second tab extending outwardly a third edge of the contact flange, wherein the second and third edges are substantially perpendicular to the mounting flange and substantially parallel to each other.

40. A probe assembly comprising:

a housing;

a substrate disposed in said housing;

a probe tip holder secured to a first end of the substrate, the probe tip holder comprising a socket;

at least one probe tip extending from said housing and electrically coupled to said substrate; and at least one contact coupled to said substrate and adapted to provide physical and electrical connectivity between said substrate and a respective probe tip, each of said at least one contact comprising:

a contact flange adapted for contacting the probe tip;

a mounting flange extending from a first edge of the contact flange in an orientation substantially perpendicular to the contact flange, said mounting flange for coupling to a surface of the substrate; and a second flange extending from a second edge of the contact flange in a spaced-apart relation to the mounting flange, the second edge being substantially parallel to the first edge, and adapted for coupling to a second surface of the substrate.

41. The apparatus of claim 40, further comprising:

a solder flange extending from a distal end of said mounting flange, and opposite said first edge of the contact flange.

42. The apparatus of claim 40, wherein the contact flange further comprises:

a substantially circular indentation.

43. The apparatus of claim 42, further comprising:

a bore formed substantially through a center of said indentation.

44. The apparatus of claim 40, wherein the mounting flange further comprises:

at least one aperture.

45. The apparatus of claim 40, wherein the solder flange further comprises:

at least one aperture.

46. The apparatus of claim 40, wherein the contact flange further comprises:

at least first tab extending outward from a second edge of the contact flange; and at least a second tab extending outwardly a third edge of the contact flange, wherein the second and third edges are substantially perpendicular to the mounting flange and substantially parallel to each other.

* * * * *